(12) United States Patent
Suvanto

(10) Patent No.: US 9,247,331 B2
(45) Date of Patent: Jan. 26, 2016

(54) TEMPERATURE COMPENSATED MICROPHONE

(75) Inventor: Mikko Veli Aimo Suvanto, Wilkinsburg, PA (US)

(73) Assignee: Nokia Technologoies Oy, Espoo (FI)

( * ) Notice: Subject to any disclaimer, the term of this patent is extended or adjusted under 35 U.S.C. 154(b) by 734 days.

(21) Appl. No.: 13/381,621

(22) PCT Filed: Jun. 29, 2009

(86) PCT No.: PCT/IB2009/006115
§ 371 (c)(1),
(2), (4) Date: Mar. 21, 2012

(87) PCT Pub. No.: WO2011/001195
PCT Pub. Date: Jan. 6, 2011

(65) Prior Publication Data
US 2012/0269363 A1    Oct. 25, 2012

(51) Int. Cl.
*H03G 3/00* (2006.01)
*H04R 1/04* (2006.01)
(Continued)

(52) U.S. Cl.
CPC .. *H04R 1/04* (2013.01); *H03F 1/30* (2013.01); *H03F 2200/468* (2013.01);
(Continued)

(58) Field of Classification Search
CPC ...... H04R 19/016; H04R 19/04; H04R 29/04; H04R 3/007; H04R 9/06; H04R 9/08; H04R 1/04; H04R 2201/003; H04R 1/04; H04R 1/1083; H04R 3/00; H04R 3/002; H04R 19/005; H03F 2200/447; H03F 2200/468; H03F 1/30; H03F 2203/45284; H03F 2203/45286; G10K 2210/3028; G10K 2210/12; G10K 2210/128; G10K 2210/1282; G10K 11/002; G10L 21/0208; H03G 3/00
USPC .............. 381/107, 55, 59, 104, 120; 330/289, 330/143, 298, 107, 256, 307
See application file for complete search history.

(56) References Cited

U.S. PATENT DOCUMENTS 4,013,845 A    3/1977    Sugimoto et al.
4,142,073 A    2/1979    Agneus et al.
(Continued)

FOREIGN PATENT DOCUMENTS

CN    101385392 A    3/2009
EP    0032533 A1    7/1981
(Continued)

OTHER PUBLICATIONS

Bunyan, DREAMSys MEMS Microphone Specifications, QINETIQ/EMEA/S&DU/TS0709002, Nov. 30, 2007, pp. 1-4.*
(Continued)

*Primary Examiner* — Davetta W Goins
*Assistant Examiner* — Oyesola C Ojo
(74) *Attorney, Agent, or Firm* — Harrington & Smith

(57) ABSTRACT

A method and a device for eliminating or minimizing the sensitivity changes in a microphone due to temperature changes. The temperature-induced changes in the sensitivity can be caused by the changes in the sound-to-electrical signal transducer, in the microphone membrane, in the ASIC or other reasons. One or more temperature dependent components in the microphone or in a microphone module are used to offset the temperature-induced changes in the sensitivity. Sensitivity of a microphone is defined as the output voltage for a specific acoustic stimulus and load condition.

13 Claims, 7 Drawing Sheets

(51) Int. Cl.
  *H04R 19/00* (2006.01)
  *H03F 1/30* (2006.01)
  *H04R 19/01* (2006.01)

(52) U.S. Cl.
  CPC ............... *H03F 2203/45284* (2013.01); *H03F 2203/45286* (2013.01); *H03G 3/00* (2013.01); *H04R 19/005* (2013.01); *H04R 19/016* (2013.01); *H04R 2201/003* (2013.01)

(56) References Cited

U.S. PATENT DOCUMENTS

| | | | | |
|---|---|---|---|---|
| 5,633,935 | A * | 5/1997 | Kanamori et al. | 381/26 |
| 7,142,682 | B2 * | 11/2006 | Mullenborn | H04R 19/005 381/322 |
| 7,342,455 | B2 * | 3/2008 | Behzad et al. | 330/289 |
| 8,223,981 | B2 * | 7/2012 | Haila | H04R 3/005 381/57 |
| 8,358,296 | B2 * | 1/2013 | Anderson | G02B 7/008 345/211 |
| 8,385,564 | B2 * | 2/2013 | Pfaffinger | H03F 1/30 330/256 |
| 8,643,129 | B2 * | 2/2014 | Laming | B81C 1/00158 257/415 |
| 2005/0152015 | A1 | 7/2005 | Anderson et al. | |
| 2007/0160247 | A1 | 7/2007 | Makihata et al. | |
| 2007/0201710 | A1 * | 8/2007 | Suzuki | B81B 3/0072 381/174 |
| 2007/0262820 | A1 | 11/2007 | Pfaffinger et al. | |

FOREIGN PATENT DOCUMENTS

| | | | | |
|---|---|---|---|---|
| JP | 2007082233 | A | 3/2007 | |
| JP | 2008-256433 | A | 10/2008 | |
| JP | 2008256433 | * | 10/2008 | ............. G01H 17/00 |
| JP | 2009-118264 | A | 5/2009 | |
| JP | 2009118264 | * | 5/2009 | ............. H04R 19/14 |
| WO | WO 0065873 | A1 * | 11/2000 | ............. H04R 25/00 |

OTHER PUBLICATIONS

Office Action received for corresponding Korean Application No. 2012-7002412, dated Oct. 24, 2013, 5 pages.
International Search Report and Written Opinion received for corresponding Patent Cooperation Treaty Application No. PCT/IB2009/006115, dated Mar. 8, 2010, 12 pages.
Office Action received for corresponding Korean Application No. 2012-7002412, dated Apr. 8, 2013, 3 pages.
International Preliminary Report on Patentability received for corresponding Patent Cooperation Treaty Application No. PCT/IB2009/006115, dated Jan. 4, 2012, 6 pages.

* cited by examiner

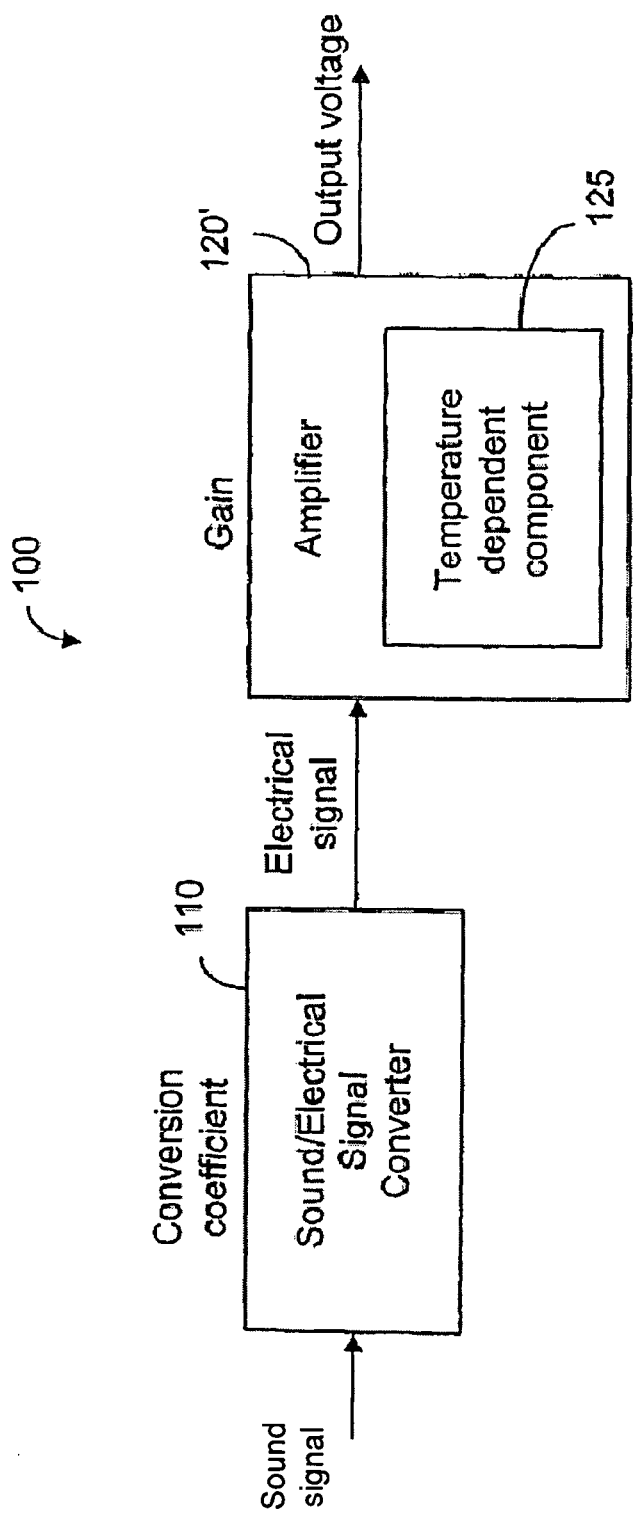

TEMPERATURE COMPENSATED MICROPHONE

RELATED APPLICATION

This application was originally filed as PCT Application No. PCT/IB2009/006115 filed on Jun. 29, 2009, which is incorporated herein by reference in its entirety.

TECHNICAL FIELD

This disclosure relates to microphones. In particular, it relates to a method for improving the microphone performance regarding the changes in microphone sensitivity in response to the changes in temperature.

BACKGROUND ART

It is known that sensitivity of a microphone may change with variation of the ambient temperature. In a multi-microphone system that uses more than one microphone for stereo operation, or to support the noise canceling algorithm, for example, different sensitivity changes from one microphone to another caused by temperature variation may affect the performance of the microphone system. As a result, the quality of uplink (from microphone to amplifier) may be adversely affected. Thus, a method for compensating the sensitivity change caused by the temperature difference is needed.

SUMMARY OF THE INVENTION

The present invention provides a method and a device for eliminating or minimizing the sensitivity changes in a microphone due to temperature changes. The temperature-induced changes in the sensitivity can be caused by the changes in the sound-to-electrical signal transducer, in the microphone membrane, in the ASIC or other reasons. The present invention uses one or more temperature dependent components in the microphone or in a microphone module to offset the temperature-induced changes in the sensitivity. Sensitivity of a microphone is defined as the output voltage for a specific acoustic stimulus and load condition.

Thus, the first aspect of the present invention is an apparatus, comprising:

an amplifier, configured to respond to an electrical signal indicative of a sound signal, for providing an electrical output based on a sensitivity value defining by a relationship between the sound signal and the electrical output; and a temperature dependent element configured to provide a change signal indicative of a change in temperature, the change signal arranged to change a gain of the amplifier for maintaining the sensitivity value substantially constant in a temperature range based on the change signal.

According to one embodiment of the present invention, the amplifier comprises:

a pre-amplification module configured to respond to the electrical signal for providing a pre-amplified signal, and a second amplification module configured to the pre-amplified signal for providing the electrical output, and wherein the change signal comprises a voltage for controlling a pre-amplification gain in the pre-amplification module.

According to another embodiment of the present invention, the amplifier comprises:

a pre-amplification module configured to respond to the electrical signal for providing a pre-amplified signal, and a second amplification module configured to respond to the pre-amplified signal for providing the electrical output, wherein the temperature dependent element is a part of the pre-amplification module for providing a voltage for controlling a pre-amplification gain in the pre-amplification module.

According to various embodiments of the present invention, the apparatus comprises a microphone, the microphone comprising a sound-to-electrical signal converter, said converter configured to respond to the sound signal for providing an electrical signal indicative of the sound signal to the amplifier.

The second aspect of the present invention is a method, comprising:

arranging a temperature dependent element for providing a change signal for use in a microphone, the change signal indicative of a change in temperature, the microphone configured to respond to a sound signal for providing an electrical output based on a sensitivity value of the microphone; and maintaining the sensitivity value of the microphone substantially constant in a temperature range based on the change signal.

According to one embodiment of the present invention, the microphone comprises:

a sound-to-electrical signal conversion part configured to respond to the sound signal for providing the electrical signal; and an amplification part, configured to respond to the electrical signal for providing the electrical output based on a gain, and the method comprises conveying the change signal to the amplification part for adjusting the gain so as to maintain the sensitivity value substantially constant.

According to another embodiment of the present invention, the microphone comprises:

a sound-to-electrical signal conversion part configured to respond to the sound signal for providing the electrical signal, and an amplification part, and the method comprises:

pre-amplifying the electrical signal based on the electrical signal for providing a pre-amplified signal; and further amplifying the pre-amplified signal for providing the electrical output, wherein said pre-amplifying is adjusted based on the change signal so as to maintain the sensitivity value substantially constant.

According to various embodiments of the present invention, the change signal is provided in a voltage for adjusting said pre-amplifying.

The third aspect of the present invention is a microphone, comprising:

a sound-to-electrical conversion part configured to receive a sound signal for providing an electrical signal indicative of the sound signal; and an amplification part, responsive to the electrical signal, for providing an electrical output based on a sensitivity value defining a relationship between the sound signal and the electrical output, the amplification part having a gain arranged to respond to a change in temperature for maintaining the sensitivity value substantially constant in a temperature range based on the change signal.

In one embodiment of the present invention, the microphone further comprises:

a temperature dependent element for providing a change signal indicative of the change in temperature, the change signal arranged to change the gain of the amplification part for maintaining the sensitivity value substantially constant in a temperature range based on the change signal.

According to one embodiment of the present invention, the amplification part comprises:

a pre-amplification module configured to respond to the sound signal for providing a pre-amplified signal, and a second amplification module configured to the pre-amplified signal for providing the electrical output, and wherein the change signal comprises a voltage for controlling a pre-amplification gain in the pre-amplification module.

According to another embodiment of the present invention, the amplification part comprises:

a pre-amplification module configured to respond to the sound signal for providing a pre-amplified signal, and a second amplification module configured to respond to the pre-amplified signal for providing the electrical output, wherein the temperature dependent element is a part of the pre-amplification module for providing a voltage for controlling a pre-amplification gain in the pre-amplification module.

The fourth aspect of the present invention is an electronic device comprising:

a first microphone as described in the third aspect of the present invention;

a second microphone as described in the third aspect of the present invention; and a control module configured to equalize the sensitivity value of the first microphone to the sensitivity value of the second microphone.

The electronic device can be a mobile terminal.

The fifth aspect of the present invention is a mobile terminal having at least one apparatus as described in the first aspect of the present invention.

BRIEF DESCRIPTION OF THE DRAWINGS

The features and advantages of the invention will become apparent from a consideration of the subsequent detailed description presented in connection with accompanying drawings, in which:

FIG. 4b is a block diagram of a microphone, according to another embodiment of the present invention.

DETAILED DESCRIPTION

Figure 1:
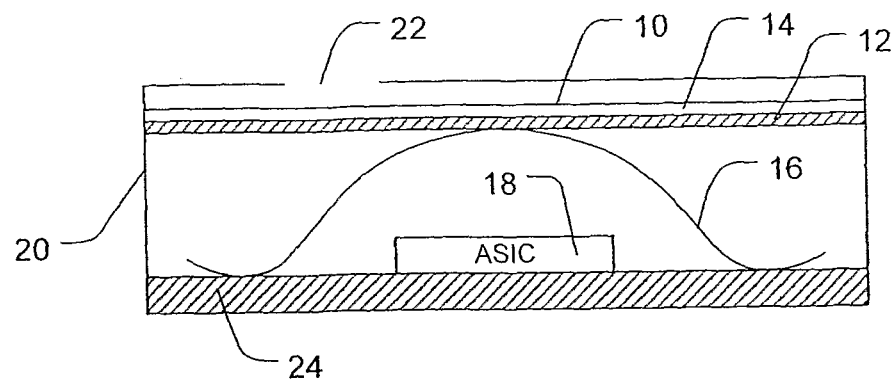
FIG. 1 is a schematic cross sectional view of an electret condenser microphone.

Microphones for use in portable electronic devices include two major types: electret condenser microphone (ECM) and micro electro mechanical system (MEMS) microphone. FIG. 1 shows a cross section of an exemplary electret condenser microphone (ECM). The ECM comprises a vibrating diaphragm 10, a fixed back plate 12 which is placed to be opposed to the vibrating diaphragm via an air layer 14; and a circuitry 18, such as an application-specific integrated circuit (ASIC), for converting an electrostatic capacity between the vibrating diaphragm 10 and the fixed back plate 12 to an electric signal. The microphone is incorporated in a casing 20 that has one or more sound ports 22 for receiving acoustic pressure waves. The ASIC 18 and the casing 20 are mounted on a substrate such as a printed wiring board (PWB) 24. A spring 16 connects the back plate 12 to the PWB 24 and thus the ASIC 18. The ASIC chip 18 includes a pre-amplifier and an analogue-to-digital converter. The ECM also has external connecting means for leading out the electric signals (not shown).

Figure 2:
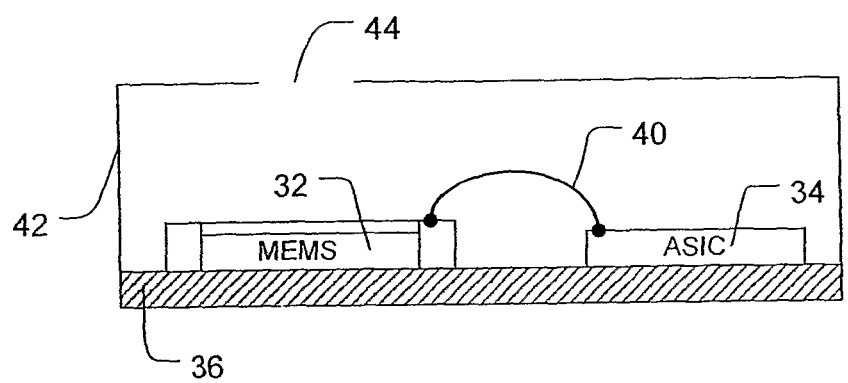
FIG. 2 is a schematic cross sectional view of a micro-electro-mechanical system (MEMS) microphone.

FIG. 2 shows a micro-electro-mechanical system (MEMS) microphone. The MEMS microphone comprises two chips: a MEMS chip 32 and an ASIC chip 34. Both chips are mounted on a substrate PWB 36. Connecting between two chips is a bond wire 40. The microphone is incorporated in a casing 42 that has one or more sound ports 44 for receiving acoustic pressure waves. The MEMS chip 32 includes a condenser microphone element etched in silicon. The ASIC chip 34 includes a pre-amplifier, an analogue-to-digital converter and a charge pump for biasing the MEMS microphone element. It is possible to include the MEMS element in the ASIC. Moreover, the ASIC may include an analog-to-digital converter (ADC) and/or a charge pump, for example. The ASIC detects the capacitive variations, converts them into electrical signals and passes them to appropriate processing means (may be external to the microphone), such as a baseband processor or an amplifier.

One important parameter of a microphone is sensitivity. Sensitivity of a microphone is defined as the output voltage for a specific acoustic stimulus and load condition. It is expressed in dBV/pa. In case of a digital interface, the sensitivity can also be given in relation to the full scale signal expressed in dBFS.

Noise canceling microphones are widely used in commercial, industry, and military applications where clear communication in noisy ambient environments is required. There are basically two types of noise canceling microphone designs: passive noise canceling microphone and active noise canceling microphone.

An active noise-canceling microphone typically comprises two individual microphone elements and a circuit element for electronically differentiating two signals from the two microphone elements. The two microphone elements are arranged such that a first microphone element receives the desired speech input and the background noise present in the vicinity of the speech, and a second microphone element senses substantially only the background noise. Therefore, a noise reduced speech signal can be generated when subtracting the second microphone signal from the first microphone signal by the circuit element of the active noise-canceling microphone.

Figure 3:
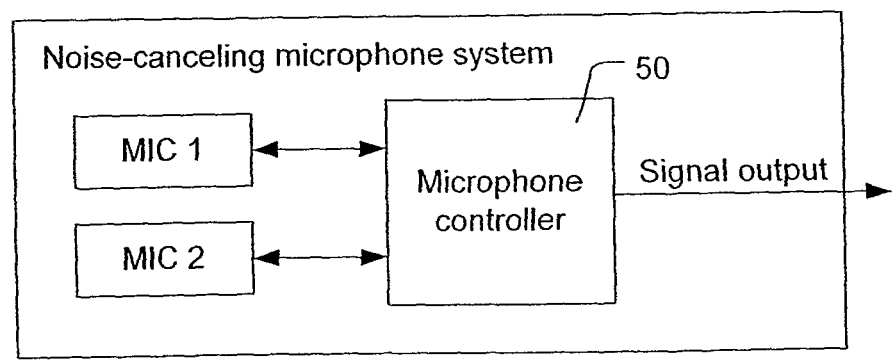
FIG. 3 shows a schematic representation of a two-microphone system.
Figure 4A:
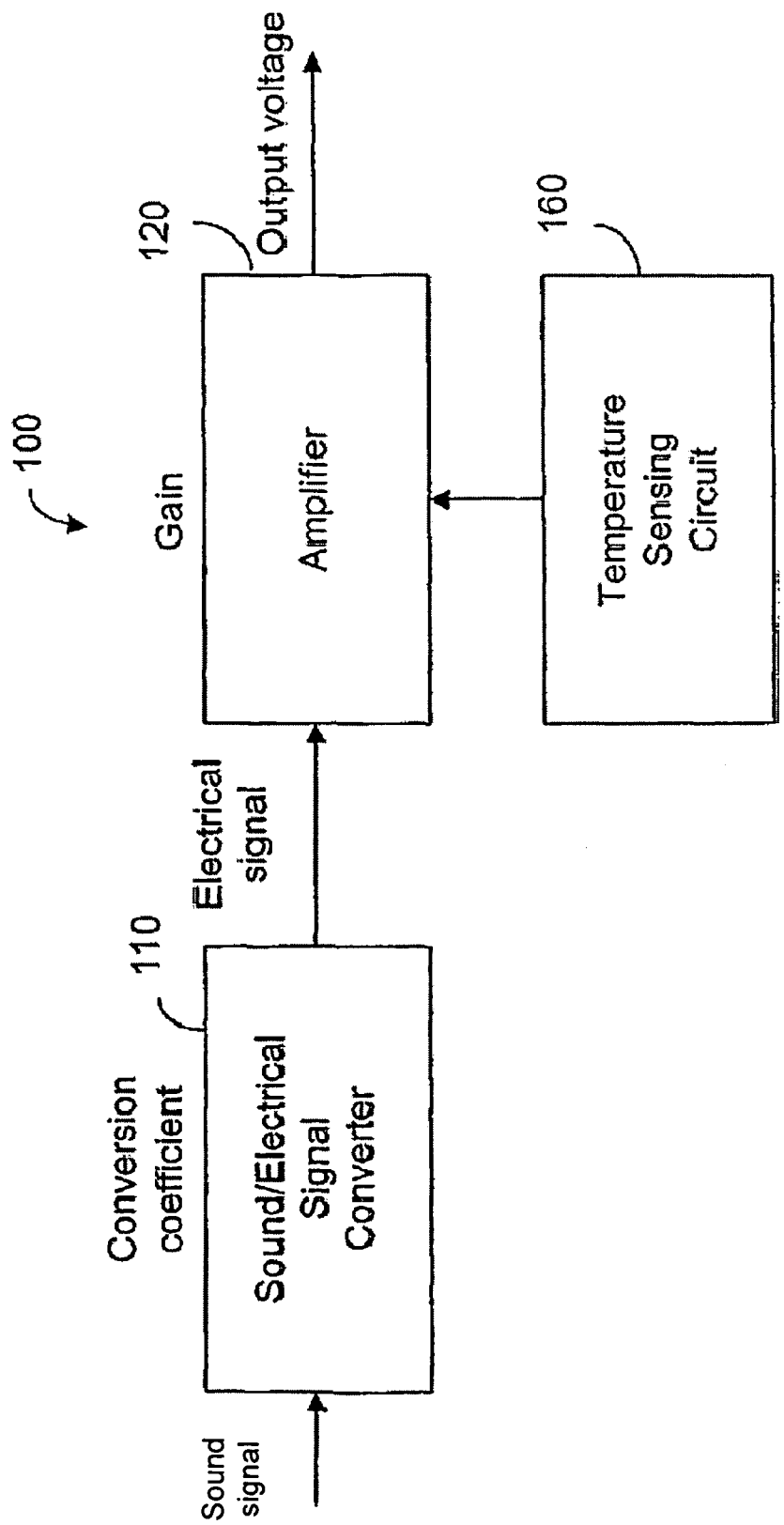
FIG. 4a is a block diagram of an exemplary microphone, according to one embodiment of the present invention.

The above described noise-canceling microphone is shown in a block diagram in FIG. 3, where microphones 1 and 2 are connected to a microphone controller 50. The controller 50 comprises circuitry for running a noise-canceling algorithm.

Two-microphone noise-canceling algorithm deals in relative values between the two microphones. It may use a built-in calibration function to calibrate the two microphones based on relative signal levels from the microphones.

During the operation of the noise-canceling microphone system, the microphone controller monitors the output values of the microphones. The calibration function updates the gain of the second microphone on a slow pace in order to save processing power and current consumption and the two-microphone noise-canceling algorithm assumes that any difference in signal level to the two microphones is due to acoustical pressure wave level differences. However, if there is a change in one microphone output caused by temperature change, and the calibration function is not fast enough to respond, the noise canceling algorithm would not be performing as well as expected. In fact, any condition that changes the sensitivities of the two microphones differently relative to the calibrated value will deteriorate the performance of the entire system.

The sensitivity difference of the microphones in relation to each other can be caused by a relatively fast temperature difference between the microphones. This can be caused for example by a power amplifier in the device that heats the other microphone to e.g. 50 degrees centigrade. If the used microphones are not identical, for example one is MEMS and one traditional ECM, they will react differently to changes in ambient temperature and this causes the sensitivity change in one more than in the other.

Stereo-microphones are becoming more common also in portable designs.

It is thus desirable that the sensitivity of each of the multiple microphones in a stereo-microphone is temperature independent so as to maintain a fixed relationship in the sensitivity among the multiple microphones.

The present invention provides a method and a device for compensating the temperature change induced sensitivity changes of the microphone elements in a noise-canceling microphone system. In the MEMS noise-canceling microphone system, for example, this can be done by implementing a temperature compensation circuit in either the pre-amp (temperature dependent gain) or the charge pump (temperature dependent charge pump output) of each microphone element.

Figure 5:
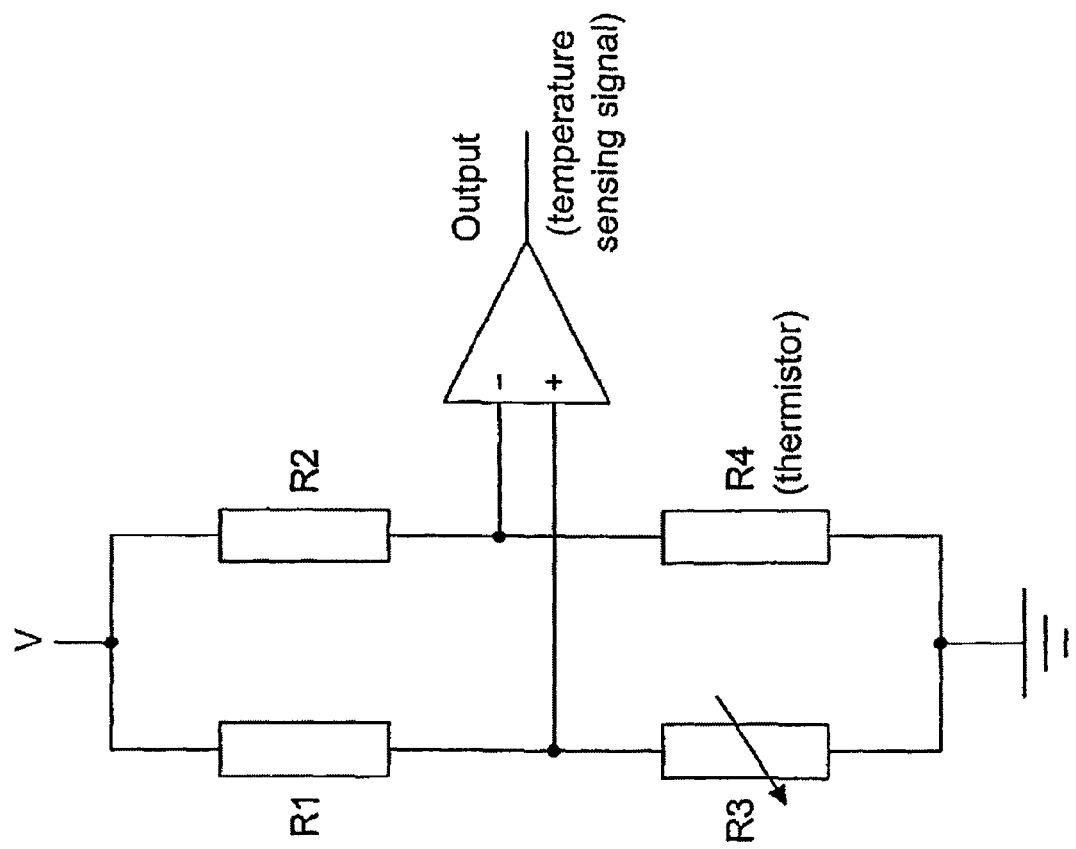
FIG. 5 is an exemplary temperature sensing circuit, according to one embodiment of the present invention.

In general, temperature can be sensed by a temperature sensing circuit. The output of the temperature sensing circuit can be used to adjust the sensitivity of the microphone by controlling the gain of a voltage controlled amplifier, for example. In an embodiment of the present invention as shown in FIG. 5a, the microphone comprises three components. Block 110 presents a sound/electrical signal converter which provides an electrical signal, in response to a sound signal, to the input of an amplifier 120. The gain of the amplifier 120 can be adjusted by a temperature sensing circuit 160. As such, the sensitivity of the microphone can be adjusted by a temperature sensing signal. The gain of the amplifier 120 can be adjusted or controlled in different ways. For example, the amplifier 120 may have a pre-amplifier (see FIG. 9) and the gain of the pre-amplifier is voltage controlled. The control voltage, in this case, can be the temperature sensing signal. Thus, in one embodiment of the present invention, the ASIC includes a pre-amplifier. Additionally, the ASIC also includes an ADC.

In another embodiment of the present invention, the temperature sensing component or circuit 125 is part of the amplifier 120', as shown in FIG. 5b.

Figure 6:
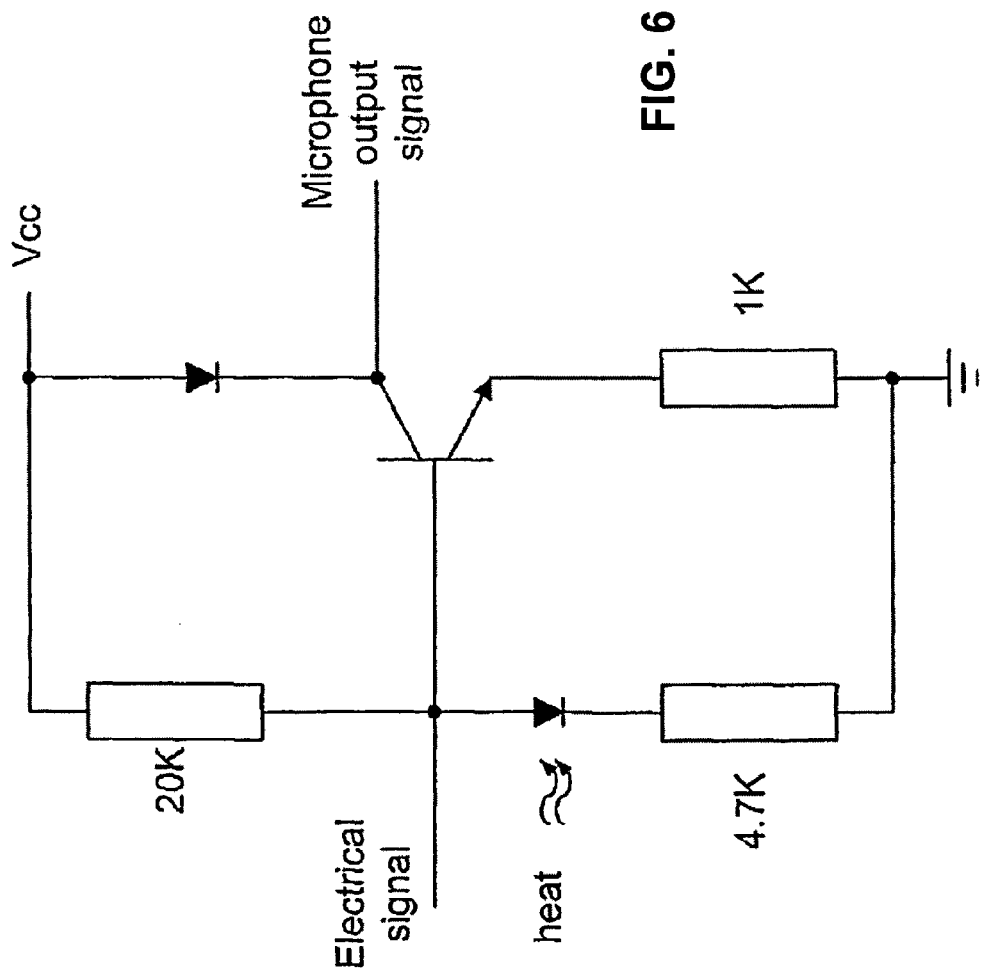
FIG. 6 is an exemplary voltage controlled amplifier, according to one embodiment of the present invention.

FIG. 6 illustrates an exemplary temperature sensing circuitry which has a temperature dependent voltage output. As shown in FIG. 6, the circuit has two voltage dividers for providing two voltages to an op-amp. In the circuit, R1, R2 are regular resistors. R3 is an adjustable resistor and R4 is a temperature sensitive resistor, such as a thermistor. As the temperature changes, the output of the op-amp also changes. Thus, the output from the op-amp can be used to adjust the sensitivity of the microphone due to temperature changes. It is possible that the temperature dependent output signal is sent to signal processing as part of the amplification stage. The amplification can be carried out in the ASIC, for example.

One possibility is that the output signal is submitted to an ADC, such as a sigma delta modulator. In general, the sigma delta modulator encodes high resolution signal into lower resolution using pulse delta modulation (PDM). For example, dBFS level of a signal can be controlled by taking input from the temperature dependent voltage output.

Figure 7:
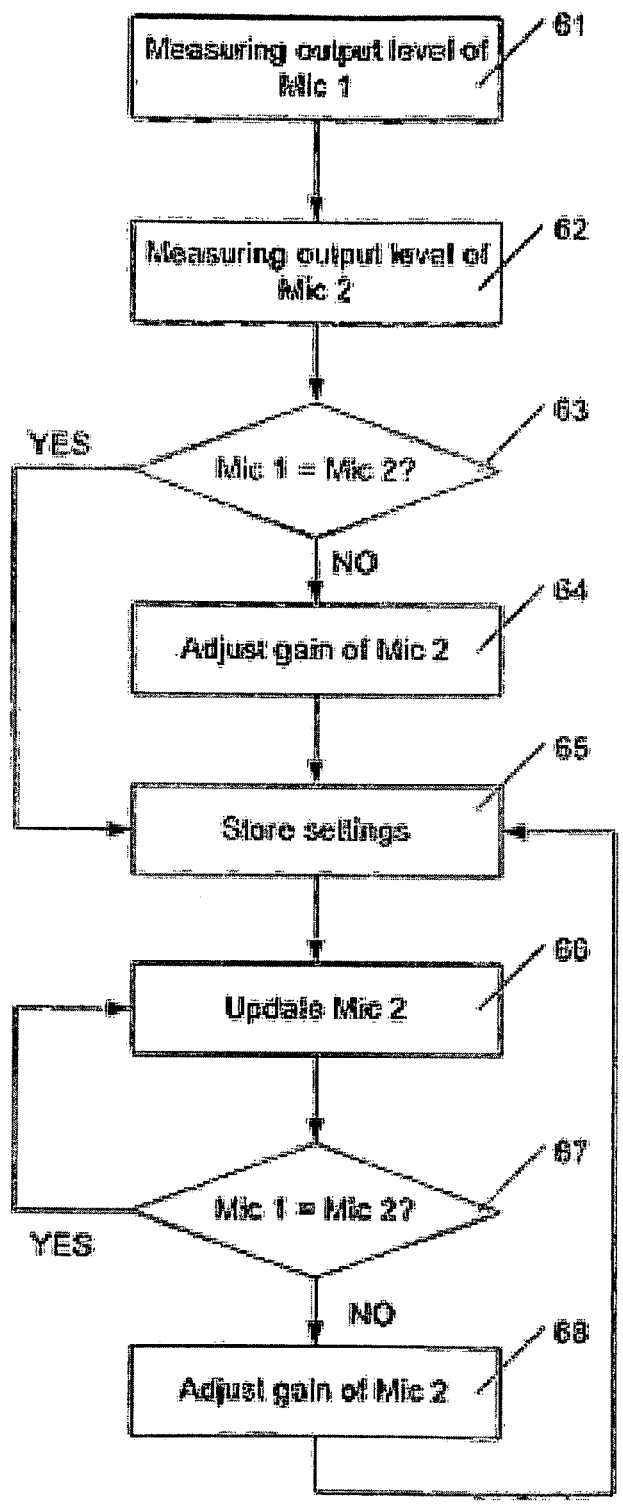
FIG. 7 is a flowchart of a calibration procedure in a two-microphone system.

In some cases the temperature dependency of the microphone is not caused by temperature dependency of the microphone element. Instead, the temperature dependency is caused by the ASIC. As an example, an amplifier as shown in FIG. 7 can be used as a temperature-compensated amplifier to achieve temperature-independent gain and the temperature independent sensitivity of a microphone. As shown in FIG. 7, a diode on the voltage divider is a temperature dependent component. The resistance of the diode or the current passed through the diode can be a function of the temperature. The amount of the current change due to the change in temperature is designed such that the gain of the amplifier is temperature independent. As such, the sensitivity of the microphone can be substantially independent of the temperature, or the sensitivity value of the amplifier is substantially constant through a predetermined temperature range.

It should be noted that the temperature changes can be caused by the environment characteristics such as the air temperature, but they can also be caused by the microphone or microphone system itself. The gain changes in the amplifier can be used to offset the changes in the other part of the microphone, such as the microphone membrane, the transducer, or the ASIC. The temperature dependent gain is designed to cancel or minimize the overall sensitivity change of the microphone. Thus, the present invention provides a method and device to achieve a substantially constant sensitivity of a microphone across a temperature range. The temperature range can be from −22° F. to 140° F. (−30° C. to 60° C.), for example. According to various embodiments of the present invention, the temperature sensing component or components can be separated from an amplifier as shown in FIG. 5a. Alternatively, one or more temperature-dependent components can be used as part of the amplifier, as shown in FIG. 5b. The temperature dependent circuitry can be implemented within the ASIC as shown in FIGS. 1 and 2, for example. It is advantageous and desirable that the temperature dependent component or components are located in very close proximity of the microphone or inside a microphone module.

The temperature compensated sensitivity of the microphone, according to the present invention, is useful for a single microphone or a multi-microphone system. A multi-microphone system may have 2 or 3 or even more microphones. For example, in a directional microphone system (beam-former), 4 or more microphones may be used.

An exemplary application of the temperature independent sensitivity, according to various embodiments of the present invention, can be used in a noise-canceling scenario, 2 microphones may be used, as illustrated in FIG. 3. With such a noise-canceling scenario, it would be necessary to calibrate the sensitivity of each of the microphones.

Figure 8:
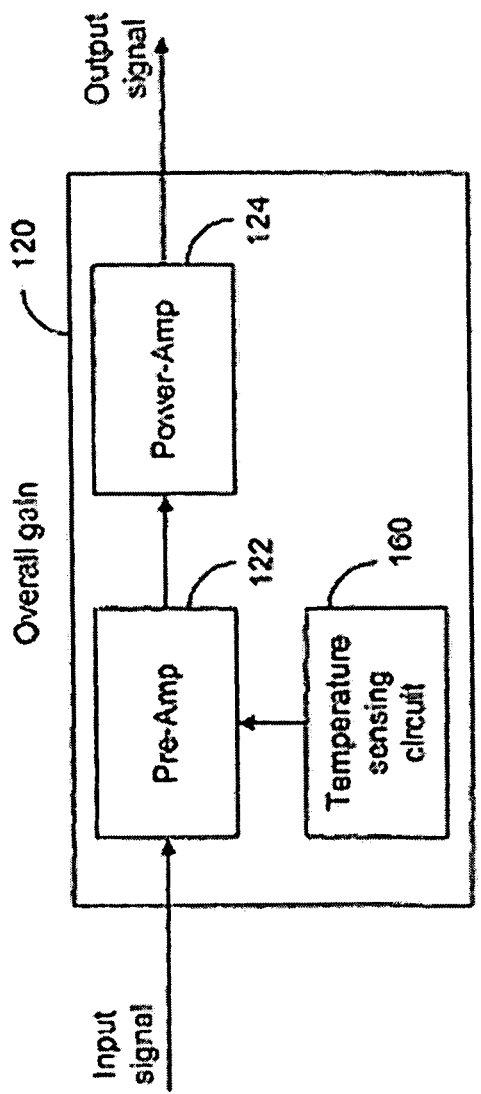
FIG. 8 is a block diagram showing an amplifier having a pre-amplification stage and a second amplification stage.

FIG. 8 shows an exemplary flow diagram for calibrating the noise-canceling microphone system with two-microphone. When the system is first used, the second microphone is off, and system is in one microphone mode until it is calibrated. The built-in calibration function waits for a situation where the signals to both microphones are assumed to be the same, such as in an area that is predominated by background noise. The noise field is loud enough and constant enough to start the calibration function. At a step 61, the output level of the first microphone is measured. Then, at a step 62, the output level of microphone 2 is measured. If the output levels of microphone 1 and microphone 2 are not equal, the pre-amplifier of the microphone 2 is adjusted (step 64) so that the output levels of the microphone 1 and 2 are the same. The system then stores the settings of the microphones (step 65). After the initial calibration, the first and the second microphones will both be kept on. During the operation of the noise-canceling microphone system, the microphone controller monitors the output values of the microphones (step 66). The calibration function updates the gain of the second microphone on a slow pace in order to save processing power and current consumption (step 68) and the two-microphone noise-canceling algorithm assumes that any difference in signal level to the two microphones is due to acoustical pressure wave level differences.

However, if there is a change in one microphone output that is caused by temperature change in this microphone, and the calibration function is not fast enough to respond, the noise canceling algorithm would not be performing well as expected. In fact, any condition that changes the sensitivities of the two microphones differently relative to the calibrated value will deteriorate the performance of the entire system.

Figure 9:
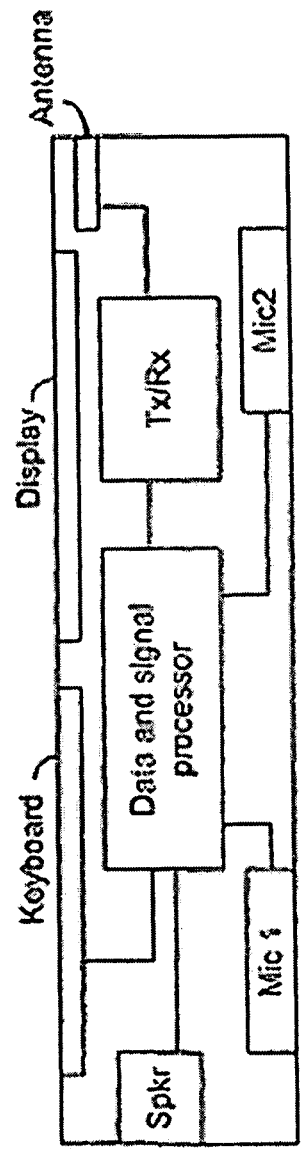
FIG. 9 is a block diagram showing an electronic device, such a mobile terminal.

FIG. 9 is a block diagram showing an amplifier 120, according to one embodiment of the present invention. As shown in FIG. 9, the amplifier 120 comprises a pre-amplification stage or module 122 followed by a second amplification stage or module 124. The gain of the pre-amplification stage 122 is voltage controlled, for example. The temperature sensing element 160 can be similar to that of the circuit as shown in FIG. 6 for providing a voltage to the pre-amplification stage 122. Alternatively, the temperature dependent element is part of the pre-amplification stage 122, similar to the circuit as shown in FIG. 7.

The microphone 100, according to various embodiments of the present invention, can be used in a mobile terminal having one or more microphones, in a stereo-microphone, in a directional microphone system (beam-former) and the like. FIG. 10 is a block diagram showing a mobile terminal having two temperature-compensated microphones, according to various embodiments of the present invention.

In summary, the present invention provides a method and a device for eliminating or minimizing the sensitivity changes in a microphone due to temperature changes. The temperature-induced changes in the sensitivity can be caused by the changes in the sound-to-electrical signal transducer, in the microphone membrane, in the ASIC or other reasons. The present invention uses one or more temperature dependent components in the microphone or in a microphone module to offset the temperature-induced changes in the sensitivity. Sensitivity of a microphone is defined as the output voltage for a specific acoustic stimulus and load condition.

Thus, the first aspect of the present invention is a method for maintaining a substantially constant sensitivity of a microphone, wherein the microphone comprises a sound-to-electrical signal conversion part and an signal amplification part and wherein the sound-to-electrical signal conversion part comprises a temperature-dependent conversion coefficient, and the signal amplification part comprises a temperature-dependent gain such that a change in the temperature-dependent conversion coefficient is substantially canceled by a change in the temperature-dependent gain.

In a different embodiment, the method comprises arranging a temperature dependent element for providing a change signal for use in a microphone, the change signal indicative of a change in temperature, the microphone configured to respond to a sound signal for providing an electrical output based on a sensitivity value of the microphone; and maintaining the sensitivity value of the microphone substantially constant in a temperature range based on the change signal. The microphone may comprise a sound-to-electrical signal conversion part configured to respond to the sound signal for providing an electrical signal; and an amplification part, configured to respond to the electrical signal for providing the electrical output based on a gain, and the method comprises conveying the change signal to the amplification part for adjusting the gain so as to maintain the sensitivity value substantially constant.

The second aspect of the present invention is a microphone comprising a sound-to-electrical conversion part and a signal amplification part, the sound-to-electrical signal conversion part comprising a temperature-dependent conversion coefficient, wherein the signal amplification part comprises a gain, the microphone further comprising a temperature-dependent component for changing the gain such that a change in the temperature-dependent conversion coefficient is substantially canceled by a change in the temperature-dependent gain.

In a different embodiment, the microphone comprises an amplifier, configured to respond to an electrical signal indicative of a sound signal, for providing an electrical output based on a sensitivity value defining by a relationship between the sound signal and the electrical output; and a temperature dependent element configured to provide a change signal indicative of a change in temperature, the change signal arranged to change a gain of the amplifier for maintaining the sensitivity value substantially constant in a temperature range based on the change signal. The amplifier may comprise a pre-amplification module configured to respond to the electrical signal for providing a pre-amplified signal, and a second amplification module configured to the pre-amplified signal for providing the electrical output, and wherein the change signal comprises a voltage for controlling a pre-amplification gain in the pre-amplification module. The amplifier may comprise a pre-amplification module configured to respond to the electrical signal for providing a pre-amplified signal, and a second amplification module configured to respond to the pre-amplified signal for providing the electrical output, wherein the temperature dependent element is a part of the pre-amplification module for providing a voltage for controlling a pre-amplification gain in the pre-amplification module.

In another embodiment, the microphone comprises a sound-to-electrical conversion part configured to receive a sound signal for providing an electrical signal indicative of the sound signal; and an amplification part, responsive to the electrical signal, for providing an electrical output based on a sensitivity value defining a relationship between the sound signal and the electrical output, the amplification part having a gain arranged to respond to a change in temperature for maintaining the sensitivity value substantially constant in a temperature range based on the change signal. The microphone may also comprise a temperature dependent element for providing a change signal indicative of the change in temperature, the change signal arranged to change the gain of the amplification part for maintaining the sensitivity value substantially constant in a temperature range based on the change signal.

The third aspect of the present invention is an electronic device comprising one or more microphones, according to various embodiments of the present invention.

Although the present invention has been described with respect to one or more embodiments thereof, it will be understood by those skilled in the art that the foregoing and various other changes, omissions and deviations in the form and detail thereof may be made without departing from the scope of this invention.

What is claimed is:

1. An apparatus, comprising:
   a micro-electro-mechanical system microphone, comprising:
   a micro-electro-mechanical system microphone element comprising a sound-to-electrical signal converter, the converter configured to provide an electrical signal to an input of at least one amplifier module in response to a sound signal; and
   an integrated circuit comprising:
      the at least one amplifier module configured to respond to the electrical signal for providing an amplified signal so as to provide an electrical output based on a sensitivity value defined by a relationship between the sound signal and the electrical output; and
      a temperature dependent element configured to provide a change signal indicative of a change in temperature, the change signal arranged to change a gain of the at least one amplifier for maintaining the sensitivity value substantially constant in a temperature range.

2. An apparatus according to claim 1, wherein the at least one amplifier module comprises a pre-amplification module configured to respond to the electrical signal for providing a pre-amplified signal, and a second amplification module configured to respond to the pre-amplified signal for providing the electrical output, and wherein the change signal comprises a voltage for controlling a pre-amplification gain in the pre-amplification module.

3. An apparatus according to claim 1, wherein the at least one amplifier module comprises a pre-amplification module configured to respond to the electrical signal for providing a pre-amplified signal, and a second amplification module configured to respond to the pre-amplified signal for providing the electrical output, wherein the temperature dependent element is a part of the pre-amplification module for providing a voltage for controlling a pre-amplification gain in the pre-amplification module.

4. A method comprising:
   providing, in a micro-electro-mechanical system microphone, a micro-electro-mechanical system microphone element comprising a sound-to-electrical signal converter, the converter configured to provide an electrical signal to an input of at least one amplifier in response to a sound signal;
   arranging, in an integrated circuit in the micro-electro-mechanical system microphone, a temperature dependent element for providing a change signal for use in the at least one amplifier, the at least one amplifier being part of the integrated Circuit and configured to provide an electrical output based on a sensitivity value defined by a relationship between the sound signal and the electrical output, the change signal indicative of a change in temperature, the micro-electro-mechanical system microphone configured to respond to the sound signal for providing the electrical output based on a sensitivity value of the micro-electro-mechanical system microphone; and
   maintaining, in the micro-electro-mechanical system microphone and by using at least the at least one amplifier, the sensitivity value of the micro-electro-mechanical system microphone substantially constant in a temperature range based on the change signal.

5. A method according to claim 4, further comprising conveying the change signal to the amplifier for adjusting gain so as to maintain the sensitivity value substantially constant.

6. A method according to claim 4, wherein the at least one amplifier comprises a pre-amplification module and a second amplification module, and wherein the method further comprises: pre-amplifying using the pre-amplification module the electrical signal for providing a pre-amplified signal; and further amplifying by the second amplification module the pre-amplified signal for providing the electrical output, wherein said pre-amplifying is adjusted based on the change signal so as to maintain the sensitivity value substantially constant.

7. A method according to claim 6, wherein the change signal is provided in a voltage for adjusting said pre-amplifying.

8. An electronic device, comprising:
   first and second micro-electro-mechanical system microphones, each of the first and second micro-electro-mechanical system microphones comprising:
      a micro-electro-mechanical system microphone element comprising a sound-to-electrical signal converter, the converter configured to receive a sound signal and provide an electrical signal indicative of the sound signal; and
      an amplification part, responsive to the electrical signal, for providing an electrical output of the micro-electro-mechanical system microphone based on a sensitivity value defining a relationship between the sound signal and the electrical output, the amplification part having a gain arranged to respond to a change in temperature for maintaining the sensitivity value substantially constant in a temperature range;
   and
   a control module configured to equalize the sensitivity value of the first microphone to the sensitivity value of the second microphone.

9. An electronic device according to claim 8, wherein each of the first and second micro-electro-mechanical system microphones further comprises: a temperature dependent element for providing a change signal indicative of the change in temperature, the change signal arranged to change the gain of the amplification part for maintaining the sensitivity value of the micro-electro-mechanical system microphone substantially constant in a temperature range based on the change signal.

10. An electronic device according to claim 9, wherein the amplification part for each of the first and second micro-electro-mechanical system microphones comprises: a pre-amplification module configured to respond to the electrical signal for providing a pre-amplified signal, and a second amplification module configured to the pre-amplified signal for providing the electrical output, and wherein the change signal comprises a voltage for controlling a pre-amplification gain in the pre-amplification module.

11. An electronic device according to claim 9, wherein the amplification part for each of the first and second micro-electro-mechanical system microphones comprises a pre-amplification module configured to respond to the electrical signal for providing a pre-amplified signal, and a second amplification module configured to respond to the pre-amplified signal for providing the electrical output, wherein the pre-amplification module comprises the temperature dependent element providing a voltage indicative of the change signal for controlling a pre-amplification gain in the pre-amplification module.

12. An electronic device according to claim 8, comprising a mobile terminal.

13. A mobile terminal device comprising at least one apparatus according to claim 1.

* * * * *

UNITED STATES PATENT AND TRADEMARK OFFICE
CERTIFICATE OF CORRECTION

| | |
|---|---|
| PATENT NO. | : 9,247,331 B2 |
| APPLICATION NO. | : 13/381621 |
| DATED | : January 26, 2016 |
| INVENTOR(S) | : Mikko Veli Aimo Suvanto |

It is certified that error appears in the above-identified patent and that said Letters Patent is hereby corrected as shown below:

In the claims,

In Claim 5:
Column 10, line 2, "the amplifier" should be deleted and --the at least one amplifier-- should be inserted.

Signed and Sealed this
Nineteenth Day of April, 2016

Michelle K. Lee
*Director of the United States Patent and Trademark Office*